United States Patent [19]

Boynton

[11] 3,973,322
[45] Aug. 10, 1976

[54] MASS SOLDERING SYSTEM AND METHOD
[75] Inventor: Kenneth G. Boynton, Milford, N.H.
[73] Assignee: Hollis Engineering, Inc., Nashua, N.H.
[22] Filed: May 13, 1974
[21] Appl. No.: 469,536

[52] U.S. Cl. ................................ 29/626; 29/203 B
[51] Int. Cl.² .......................................... H05K 3/30
[58] Field of Search ............... 29/626, 627, 203 R, 29/203 B, 203 P, 203 S, 484, 487, 488, 492, 493, 495, 497, 498, 471.1, 471.5, 471.9, 503, 33 P; 118/74; 83/923, 925; 228/18, 19, 33, 36, 37, 39, 43, 46, 47

[56] References Cited
UNITED STATES PATENTS

| | | | |
|---|---|---|---|
| 3,388,465 | 6/1968 | Johnston | 29/626 |
| 3,568,295 | 3/1971 | Moran | 29/503 X |
| 3,574,934 | 4/1971 | DeRose | 29/626 |
| 3,616,533 | 11/1971 | Heap et al. | 29/626 |
| 3,680,762 | 8/1972 | Kondo | 29/626 X |
| 3,704,515 | 12/1972 | Nelson | 174/68.5 X |
| 3,780,431 | 12/1973 | Feeney | 29/626 |

Primary Examiner—C.W. Lanham
Assistant Examiner—James R. Duzan
Attorney, Agent, or Firm—Schiller & Pandiscio

[57] ABSTRACT

Electrical and electronic components loosely mounted in a circuit board with their leads extending through holes in the board are temporarily stabilized in position in the board by treating the board and component leads at least in part with a selected material in liquid state, and hardening the material to form a solid, solder-compatible, non-metallic cement having a melting point below that of solder, coupling the board and leads to one another. The component leads may then be trimmed to finish length, and the components soldered in place. Alternatively the board may be placed in storage for future soldering. The cement is melted and displaced simultaneously with soldering. Preferred as cement are naturally occurring and synthetic waxes having a melting point in the range of about 120–195°F. In a preferred embodiment of the invention compatible flux active agents and/or wetting agents may be intermixed with the liquid material whereby the board and component leads may be fluxed simultaneously with treating to temporarily stabilize the components in the board.

27 Claims, 4 Drawing Figures

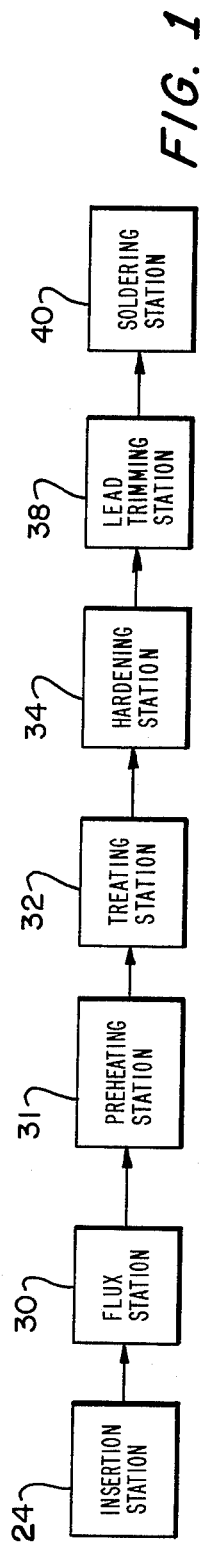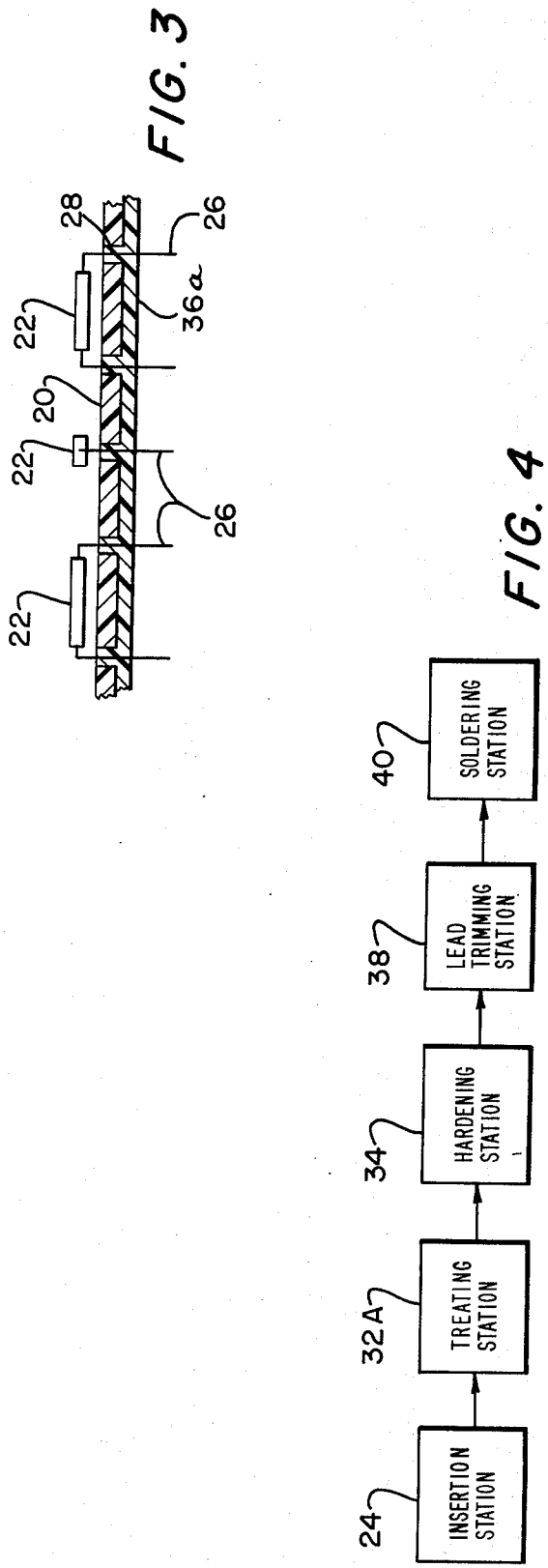

MASS SOLDERING SYSTEM AND METHOD

The present invention relates to systems for assembling electrical and electronic components onto substrate circuit boards, and more specifically to systems for mass soldering components onto printed circuit boards.

Numerous processes and apparatus are well known in the art for mounting electrical and electronic components onto printed circuit boards. In general such methods comprise positioning the components onto the boards, soldering the leads of the components to the board, and cutting off the component excess leads.

A typical circuit board assembly may involve a substantial number of components, and to connect each of these components to the board individually with a soldering iron is a tedious process. Accordingly the art has proposed various systems by which a plurality of component connections to a board may be effected in a single or mass soldering operation. One type of mass soldering system involves a so-called "dip soldering" or pot soldering technique. In this type of system, an entire side of the circuit board assembly containing the printed conductors, with the leads from the circuit components projecting through various holes in the board, is briefly immersed or dipped into a body of molten solder, removed and cooled.

Another system involves passing the board through a moving stream of solder, typically in the form of a wave, i.e., a so-called "wave soldering" technique. Various wave soldering techniques form the basis of numerous patents and are described in detail in U.S. Pat. Nos. 2,993,272; 3,004,505; 3,037,274; 3,039,185; 3,056,370; 3,058,441; 3,082,520; 3,100,471; 3,196,829; 3,207,128; 3,216,642; 3,217,959; 3,266,139; 3,277,566 and others. A problem which has plagued both types of soldering systems is the deposition of excess solder in the board in the form of icicling, webbing and bridging. This excess deposition is believed to be caused by the long component leads which may touch or cross each other. Also, due to the length of the component leads it is often necessary to immerse the circuit assembly into a relatively deep solder pot or to utilize a relatively deep wave all of which may result in substantial icicling. However, relatively long component leads are generally desired to facilitate inserting the components onto the board. By the same token, some lead excess length is also generally desired to minimize the possibility that components will be dislodged in subsequent operations.

Accordingly, the art typically subjects a circuit board to two separate mass soldering operations or steps as follows: The components are first "rough" soldered to stabilize or fix the components position on the board so that the leads could be trimmed to desired length. The soldered connections are then finished in a second soldering step in which excess solder is removed. A typical prior art mass soldering procedure may thus entail the following main steps:

1. Mount the components loosely onto the circuit board with the component leads extending through holes in the board;
2. Preclean the component leads and circuit board e.g., as by fluxing;
3. Solder the clean leads to the circuit board;
4. Trim the lead excess lengths; and
5. Reflux to clean the leads exposed in trimming; and
6. Resolder to remove excess solder from the first soldering step, and to cover the leads exposed after trim.

A principal disadvantage of the prior art as above described is the requirement for the second soldering step which adds appreciably to production costs, and also increases the possibility of damaging heat sensitive components and warping the circuit board.

U.S. Pat. No. 3,568,295 to Moran proposes covering and holding components in position on a board by applying a thin sheet of plastic heat-sealable material over the components. The sheet is drawn down over the components by a vacuum, and the sheet is then heat sealed onto the board. Using this method the components are said to be sufficiently stabilized whereby the excess leads may be trimmed prior to soldering. Obvious disadvantages of this system are the requirement of special equipment for applying and sealing the sheet material, inadvertent destruction of the plastic by heat of soldering and also the need for stripping the sheet from the board after the soldering step is completed. Another disadvantage is the possibility of production of noxious fumes resulting from exposure of the plastic sheet material to molten solder temperatures. A similar process is disclosed in Johnston U.S. Pat. No. 3,388,465.

A principal object of the present invention is therefore to provide an improved apparatus, and method and materials for assembling and mass soldering of circuit boards. Another object is to provide a relatively simple apparatus and method for finish mass soldering of circuit boards in a single soldering step.

A further object is to provide apparatus and process which embodies a new and improved system and means of stabilizing components assembled in a circuit board whereby the component excess leads may be trimmed prior to soldering. Yet other objects will in part appear obvious and will in part appear hereinafter.

The invention accordingly comprises the processes involving the several steps and the relative order of one or more such steps with respect to each other, and the materials, products and apparatus possessing the features, properties and relations of elements which are exemplified in the following detailed disclosure and the scope of the application of which will be indicated in the claims.

Generally, to effect the foregoing and other objects the present invention involves temporarily stabilizing electrical and electronic components mounted on a circuit board with their leads extending through holes in the board, by application thereto of a selected material (or mixture of materials) in liquid state, and hardening the material to form a solid solder-compatible, cement coupling the leads and board. The material should not decompose at soldering temperatures, but instead should have a melting point or liquidus temperature below the molten solder. In a preferred embodiment of the invention compatible flux active agents and/or wetting agents may be intermixed with the liquid material whereby the board and component leads may be fluxed simultaneously with treating to temporarily stabilize the components in the board. Once the solid cement is formed, the component leads may then be trimmed to finish length, and the leads may then be soldered in place in a single soldering step utilizing known techniques. The cement is removed by melting simultaneously with the soldering step.

For a fuller understanding of the nature and objects of the present invention, reference should be had to the following detailed description taken in connection with the accompanying drawings wherein like numerals denote like elements, and:

FIG. 1 is a side elevational view, diagrammatically illustrating a soldering system according to the present invention;

FIG. 3 is an enlarged side-elevational view, in section showing a circuit board assembly at an intermediate stage in an alternative and preferred process of the present invention; and FIG. 4 is a side elevational view, diagrammatically illustrating an alternative and preferred soldering system according to the present invention.

Figure 2:
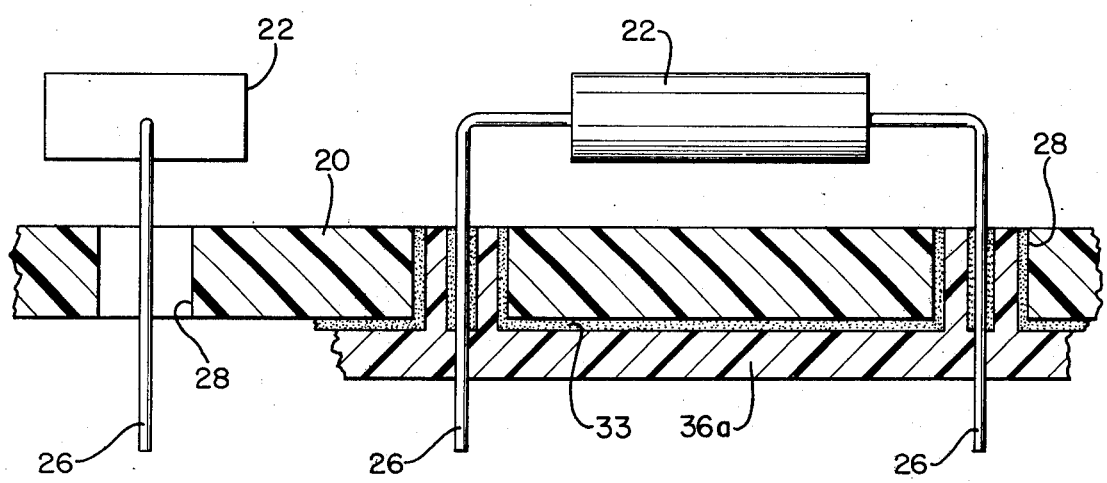
FIG. 2 is an enlarged side elevational view, in section, showing a circuit board assembly at an intermediate stage in the process of the present invention.

In the following detailed description of the present invention, the term "component lead" refers to that part of metallic conductor of an electrical or electronic component that is joined to the printed circuit pattern, i.e., the component leads, terminals, lugs, etc. The term "land" as used herein refers to that part of the metallic pattern on the printed circuit to which the lead is joined.

The terms "liquid" and "solid" which are used herein with reference to physical properties of materials, are to be understood as referring to such properties as they exist under conditions as may be specified. For example, the term "solid" then refers to a state wherein the elements of a matrix or lattice structure of a material exhibit spatial orientation which is substantially static or fixed over ordinary time periods during which the property of solidity is significant or required. The terms "harden" and "melt" which are used herein, are to be understood as referring to the process in which a material, either crystalline or amorphous, goes through in changing from a liquid to a solid, or vice versa. For example, the term "harden" may thus refer to a classical phase change wherein a liquid is cooled to below its solidus temperature. However, the term "harden" is not intended to be so limited, and may include, for example, (1) evaporating the solvent from a solution containing the selected material leaving a solid, and (2) polymerizing a liquid monomer to a solid polymer.

While there are a large number of materials which can be used as the cement in accordance with the technique of the present invention, the preferred materials are those which are normally solid under ambient conditions, which melt or congeal at a temperature in the range of from about 120° to 195°F, and are also thermally stable at the temperature of liquid solder. Among suitable materials may be mentioned naturally occurring waxes such as vegetable waxes, e.g. *Euphorbia cerifera* (candelilla), *Corzpha cerifera* (Carnauba), *Stipa Tenacission* (Esparto), *Syagrus coronata* (Ouricury), *Rhus succedaneum* (Japan wax); animal waxes, e.g. *Apis mellifera* (Beeswax), *Coccus cerifera* (Chinese insect wax); petroleum derived mineral waxes, e.g. Ceresine, Ozocerite, Microcrystalline, and, Montan waxes. Also a number of synthetic waxes (so-called "Fischer-Tropsch" waxes) are available commercially will satisfy the aforesaid criteria and are useful in accordance with the technique of the present invention. Additionally, certain polymers and resins such as polyethylene, polybutene, polyindene, polyvinyl acetate, dipentene resins, and alkyl resins can be used to achieve the advantages of the instant invention. Such polymers and resins may be applied either as a hot melt, or the polymer or resin may be applied as a solution or dispersion in a solvent or carrier, and stabilized or hardened by evaporation of solvent or carrier, or by fusing. Alternatively, such polymers and resins may be applied as a liquid monomer, or as a solution or dispersion containing the monomer, and the monomer is then hardened by polymerization, e.g. as by application of heat or ultraviolet light or by treating with a curing agent or polymerization catalyst. Such materials are considered thus to be "solder-compatible" for purposes of this invention.

Especially preferred are materials which melt upon exposure of the board to the liquid solder to form a liquid coating upon the body of liquid solder which protects the solder from oxidation, and also may act as a wetting agent to reduce the surface tension of the solder and thus facilitate soldering. It will be understood that materials that evaporate or sublime at the temperature of liquid solder may also be used as the cement in accordance with the technique of the present invention, thus are also intended to be included herein. Obviously, mixtures of compatible waxes, polymers, etc. may also be used in accordance with the teachings of the present invention.

While there are many techniques for applying the material, the preferred method involves passing the loaded circuit board through a wave of the material in liquid state so that a coating of material is deposited only on the component leads and on the surface of the board but not deposited on the circuit components.

Generally, the material is applied to the board surface and component leads in molten state, and the coated board is then cooled for a time at a temperature sufficient to solidify the material on the board and leads, and thereby stabilize the positioning of the components on the board. For example, where the material is beeswax, the wax is heated to about 155°–160°F to form the melt; the molten wax is applied to the board; and the board is then cooled to below the liquidus temperature of the wax, e.g. as by forced cool air to solidify the molten wax on the board.

Other materials require different hardening operations. For example, in the case where polyvinyl acetate is applied from aqueous solution, means should be included for speeding evaporation of the aqueous carrier, e.g. as by forced heated air.

Once substantially all of the liquid material applied to the board and component leads has hardened the leads may be cut to desired (finish) length. After the leads are cut, the components may be soldered in place, or the board with the components may be placed in storage for subsequent soldering. Soldering may be by dip soldering, wave soldering or the like which results in mass soldering of the component leads to circuit lands.

One embodiment of this invention is shown in the FIGS. 1 and 2 of the drawings. Referring to FIGS. 1 and 2 of the drawings, a printed circuit board 20 is loaded, at an inserting station 24, with a plurality of electrical or electronic components 22 at predetermined positions on board 20. The components may be inserted in the board by any method known in the art which may include manual assembly, semi-automatic, or automatic assembly which may comprise single-station or multiple-station pantagraph or numerically controlled machines all of which are well known in the art and need not be further described. It should be noted at this stage, components 22 are loosely mounted in the circuit board 20 with their leads 26 extending through holes 28 in the board. Furthermore, leads 26 are typically shown somewhat longer than will be desired or required in the completed circuit assembly. However, leads longer than necessary are desired at this stage to facilitate positioning and assembly, and also to minimize the risk that components may be displaced from their desired positions in subsequent operations.

A requirement of any soldering system is that the surface areas to be united or coated by solder must first be cleaned of unwanted oxides and other films which will otherwise interfere with wetting of the surfaces by the molten solder. This is typically accomplished by treating the surfaces to be soldered with a so-called "flux" at a fluxing station 30. The flux may be any flux well known in the art and may include, for example, a water-white resin flux, an activated resin flux or a water-soluble flux. Likewise, the flux may be applied to the circuit board and component leads by an manner well known in the art, as for example, by spraying, foaming, or from a flux wave.

The fluxed board is then passed to a preheating station 31 wherein the board is preheated in a manner well known in the art to mobilize the flux and also drive off the bulk of the flux solvent to form an active flux layer 33 on the board and leads. The board is typically heated at station 31 to a topside temperature in the range of from about 175°–200°F.

An important feature and critical requirement of the present invention is the ability to temporarily stabilize components in a board so that the component excess leads may be trimmed or cut to finish length prior to soldering. This is accomplished by treating the circuit board and components at station 32, with a selected liquid material.

The liquid material may be applied at station 32 by any manner well known in the art for applying a liquid, as for example, by spraying or dip coating. Preferably, however, the liquid material is applied from a wave of the material. The liquid material coating on the board is then hardened at station 34 to form a cement 36 coupling the board and leads (see FIG. 2). The construction of station 34 will be determined by the hardening operation required, which in turn is dependent on the nature of the material. For example, where the material is applied as a melt, station 34 should include means to cool the coated board to solidify the material. Thus station 34 may include a chill box or the like. On the other hand, depending on the nature of the material, the latter's liquidus temperature and the temperature of the ambient air, the material may harden as the board is transported between station 32 and trimming station 38. In such case station 34 will not constitute a separate defined work station. Station 34 may comprise other constructions. For example, where the material is applied as a liquid solution, station 34 should include means for speeding evaporation of the solvent or liquid carrier, e.g. a source of heated air flow. And, where the material is applied as a monomer, station 34 should include means for effecting or accelerating polymerization of the monomer, and may include, for example, a heat source or source of ultra violet light (depending on the nature of the polymerization), or may include means for applying a curing agent or the like to the liquid material coating the board.

Once the material is substantially hardened, the board is passed to trimming station 38 wherein the component excess leads are cut to finish length. If desired the board may then be passed to a second flux station (not shown) wherein the cut ends of the component leads may be treated with flux, or the board may be passed directly to the soldering station 40 wherein molten solder is applied to the board and the component leads, and simultaneously the cement is melted and displaced.

An alternative soldering system is shown in FIG. 4. The system of FIG. 4 is similar to that as in FIG. 1, in which, however, a flux material compatible with the cement is admixed with the cement material and applied to the board and component leads simultaneously with the cement (36a) application. The flux may include any of the usual flux active agents, e.g. acidic compounds, known in the art, which are compatible with the selected cement material, and may also include the usual wetting agents.

While there are a large number of flux materials which can be added to the cement in accordance with the technique of the present invention, the preferred materials are those which are soluble in or miscible with the cement material; however, flux materials which are insoluble in the cement material may also be used in which case means should be provided to agitate the mixture so as to prevent separation of the materials. The cement material acts as a carrier for the flux active agents and the wetting agent so that the usual flux carrier, e.g. alcohol, is not generaly required.

Various commercially available flux active agents may be mixed with the cement material in accordance with the technique of the present invention, among which may be mentioned various carboxylic acids such as abietic acid, citric acid, lactic acid, oleic acid and pimeric acid; amines, amine carboxylates, and amides; quarternary amonium salts; inorganic acids such as hydrochloric acid, hydrofluoric acid, orthophosphoric acid; and halogen salts such as zinc chloride. The amount of flux active agents and the wetting agents which may be added to the cement material will vary over a wide range depending upon the nature of the flux materials and the strength of flux required. For example, where the flux active agent is oleic acid, and the cement material is candellia wax, the mixture may typically comprise about 20 volume percent of the acid, the balance the wax, and is suitable for removing thin to moderate films of oxide from copper.

The board and component leads are treated with flux-cement material admixture in one step in a treating station 32A. As in the system of FIG. 1, treating may be by any manner well known in the art for applying a liquid, e.g. as by spraying, dip coating or from a wave. However, the embodiment shown in FIG. 4 has the added advantage in that it is often possible to eliminate the step of refluxing after the leads are trimmed. This latter advantage is believed due to a flow of flux across the freshly cut leads carried in the melting cement.

Although not shown, it will be understood that wax build-up (FIG. 1) and wax and flux build-up (FIG. 4) may be readily controlled by simply skimming the excess from the top of the liquid solder in station 40.

The following examples illustrate more clearly the manner in which printed circuit boards may be assembled and mass soldered according to the present invention. The invention however should not be construed as limited to the particular embodiments set forth in the examples.

EXAMPLE I

A circuit board assembly is produced as follows: The components are loaded into predetermined position in the board, and the loaded board is fluxed using Kester Flux No. 1544(manufactured by Kester Division of Litton Industries). The fluxed board is then preheated to a top surface temperature of about 140°F, prior to treating with molten candelilla wax (refined) by passing the bottom of the board through a wave of the molten wax. The latter is formed in a Hollis Model TDC-12 Wave Soldering device (manufactured by Hollis Engineering, Inc.) which, however, was modified to maintain a sump temperature of only about 170°F. The board has a residence time of two seconds in the wave. The waxed board is cooled under flowing air at ambient temperature whereupon the wax solidifies to form a cement coupling the board and leads. The resulting board after cooling below the solidus temperature of the wax appears substantially as shown in FIG. 3 of the drawings, and components are found to be stabilized in position in the board. The component leads are then cut to finish length using a rotary lead cutter and the cut leads are refluxed. The board is then passed to a soldering station comprising a Hollis Model TDC-12 Wave Soldering device containing a body of molten 63/37 solder (63 wt. percent tin, 37 wt. percent lead) (m.p. 360°F). The solder wave is approximately 12 inches long, 3 inches wide and about ¾ inch deep. A layer of soldering oil such as Hollis 225 Soldering Fluid, available from Hollis Engineering, Inc. is floated on top of the solder to protect the solder from oxidation by exposure to the atmosphere, and also acts as a wetting agent to assist soldering. The manufacturer describes this oil as comprising a relatively high viscosity mineral oil base stock in major proportion, the remainder a mixture of oxidation inhibitors, mildly acidic fatty acids and wetting agents. Heat from the molten solder melts the wax coating, and the molten solder displaces the melted wax from the board and leads. The wax mixes with and becomes part of the protective coating. An integrated circuit board assembly is obtained.

EXAMPLE II

Integrated circuit boards are produced as in Example I, in which however, the cement material is applied as a solution of polyvinyl acetate in water. The water is evaporated by heating the coated board under flowing air to 250°F, whereupon the polyvinyl acetate forms a cement coupling the board and leads. The component leads are then trimmed, and the board is soldered as in Example I.

An integrated circuit board is obtained as in Example I.

EXAMPLES III–V

Integrated circuit boards are produced as in Example I, in which, however, the cement materials and melt temperatures are as follows:

| Example No. | Cement | Cement Temperature |
|---|---|---|
| III | Beeswax | 170°F |
| IV | Ozokerite Wax | 180°F |
| V | Microcrystalline Wax | 205°F |
| VI | Chevron Refined Petroleum Wax | 168°F |

Integrated circuit board assemblies are obtained as in Example I.

EXAMPLE VII

Integrated circuit boards are produced as in Example I, in which however, the two separate fluxing steps are eliminated, and the flux is mixed with the cement material and applied to the loaded board simultaneously with the cement. For this Example the cement material chosen is Microcrystalline wax to which is added 20 vol. percent of lactic acid. The mixture is agitated constantly in order to maintain the acid in dispersion in the wax. The mixture is heated to 175°F and applied to the loaded board from a wave as in Example I. An integrated circuit board is obtained as in Example I.

EXAMPLES VIII–XI

Integrated circuit boards are produced as in Example VII, in which, however, the cement-flux mixture and melt temperatures are as follows (all percentages by volume):

| Example No. | Cement-Flux Mixture | | Cement Temperature |
|---|---|---|---|
| VIII | Candelilla Wax | (80%) | |
| | Lactic Acid | (20%) | 180°F |
| IX | Candelilla Wax | (80%) | |
| | Oleic Acid | (20%) | 165°F |
| X | Beeswax | (80%) | |
| | Oleic Acid | (20%) | 155°F |
| XI | Ozokerite | (80%) | |
| | Oleic Acid | (20%) | 178°F |

EXAMPLE XII

Integrated circuit boards are produced as in Example I, in which however, a wetting agent is mixed with the cement material and applied to the loaded board simultaneously with the cement. For this Example the cement material chosen is Microcrystalline wax to which is added 5 vol. percent of Tween which is a non-ionic dispersant comprising a mixture of polyoxyethylene sorbitan fatty acid esters. The mixture is heated to 175°F, and applied to the loaded board from a wave as in Example I. Soldering is performed without adding any additional wetting agent or protective oil to the solder bath. An integrated circuit board is obtained as in Example I.

Since certain changes will be obvious to one skilled in the art and may be made in the above disclosure without departing from the scope of the invention hereinvolved. For example, instead of applying the cement to the circuit-carrying side of the board, the cement can be deposited on the opposite side (top surface) of the board, and also on the circuit components. It will be appreciated that with the technique much of the cement may remain on the top surface of the board and not be melted or displaced during soldering. This procedure may have particular application in the case where it is desired to provide environmental protection to the circuit assembly. Still other changes will be obvious to one skilled in the art. Accordingly, it is intended that all matter contained in the above description or shown in the accompanying drawings shall be interpreted in an illustrative and not in a limiting sense.

What is claimed is:

1. A method of mass joining with solder, electrical and electronic components assembled in a perforated circuit board, said board having adjacent at least some of its perforations a metallic pattern to which the component leads can be joined by said solder, and wherein the component leads extend through at least some of the perforations in said board and excess lengths of said component leads are trimmed prior to soldering, said method comprising the steps in sequence of:

a. temporarily stabilizing said components in position on said board by coupling said board and said leads to one another with a meltable cement compatible with said solder and having a melting point below that of said solder;

b. trimming said leads;

c. immersing said board and trimmed leads at least in part in a molten body of said solder so as substantially simultaneously to cause said cement to melt and said solder to replace the melted cement on said board, and to wet said metallic pattern and leads.

2. A method according to claim 1 wherein said solder-compatible cement has a melting point temperature in the range of about 120–195°F.

3. A method according to claim 1 wherein said solder-compatible cement is selected from the group consisting of waxes, resins and polymers.

4. A method according to claim 3 wherein said cement comprises a naturally occurring wax.

5. A method according to claim 4 wherein said naturally occuring wax comprises a vegetable wax.

6. A method according to claim 4 wherein said naturally occuring wax comprises an animal wax.

7. A method according to claim 4 wherein said naturally occuring wax comprises a petroleum derived mineral wax.

8. A method according to claim 3 wherein said cement comprises a synthetic wax derived from a Fischer-Tropsch synthesis.

9. A method according to claim 3 wherein said cement comprises a resin selected from the group consisting of alkyl resins and dipentene resins.

10. A method according to claim 3 wherein said polymer is selected from the group consisting of polyethylene, polybutene, polyindene and polyvinyl acetate.

11. A method according to claim 3 wherein said cement comprises a water soluble polymer.

12. A method according to claim 1 wherein said solder-compatible cement is applied to said circuit board and leads as a selected liquid material, and including the step of hardening said liquid to form said cement.

13. A method according to claim 1 including the step of applying a flux to said circuit board and leads.

14. A method according to claim 13 wherein said flux is applied prior to the application of said liquid cement material.

15. A method according to claim 13 wherein said flux is applied simultaneously with the application of said liquid cement material.

16. A system for joining with solder electrical and electronic components assembled in a perforated circuit board, said board having a metallic pattern adjacent at least some of its perforations with the component leads extending through at least some of the perforations in said board, and comprising in combination: means for applying to said board and to said component leads a meltable cement compatible with said solder and having a melting point below that of said solder so as to couple said board and leads; means for trimming said leads to a predetermined length; and, means adapted to contain a body of molten solder and for applying said molten solder to said board and trimmed leads so as to cause said cement to melt and substantially simultaneously to replace the melted cement on said metallic pattern and on said trimmed leads with molten solder.

17. A system according to claim 16 wherein said means for applying said cement comprises a container adapted for maintaining a body of said cement in liquid state.

18. A system according to claim 16 wherein said container includes means for heating said cement so as to maintain said cement in molten condition.

19. A system according to claim 18 including means for forming said liquid as a moving wave.

20. Means according to claim 18 further including means for hardening said cement after the latter is applied to said board and leads.

21. Means according to claim 20 wherein said means for hardening comprises cooling means.

22. Means according to claim 20 wherein said means for hardening comprises heating means.

23. Means according to claim 20 wherein said means for hardening comprises means for treating said cement with a chemical agent which agent causes said cement to harden.

24. Means according to claim 20 wherein said means for hardening comprises means for exposing said board and leads to ultraviolet light.

25. A system according to claim 16 further including means for positioning said components at predetermined positions on said board.

26. A system according to claim 16 further including means for applying a flux to said board and leads.

27. A system according to claim 25 wherein said means for applying said cement is adapted to simultaneously apply said flux.

* * * * *

UNITED STATES PATENT OFFICE
CERTIFICATE OF CORRECTION

PATENT NO. : 3973322
DATED : August 10, 1976
INVENTOR(S) : Kenneth G. Boynton

It is certified that error appears in the above-identified patent and that said Letters Patent are hereby corrected as shown below:

Column 9, line 54: The term "claim 12" should be substituted for "claim 1".

Column 10, line 52: The term "claim 26" should be substituted for "claim 25".

Signed and Sealed this

Twelfth Day of October 1976

[SEAL]

Attest:

RUTH C. MASON
Attesting Officer

C. MARSHALL DANN
Commissioner of Patents and Trademarks